(12) United States Patent
Hotta et al.

(10) Patent No.: US 6,605,811 B2
(45) Date of Patent: Aug. 12, 2003

(54) ELECTRON BEAM LITHOGRAPHY SYSTEM AND METHOD

(75) Inventors: Masanao Hotta, Tokyo (JP); Yasuhiko Kojima, Tokyo (JP); Takaomi Ito, Tokyo (JP); Katsumi Yokota, Tokyo (JP); Tetsuyuki Okabayashi, Tokyo (JP); Akio Otani, Tokyo (JP); Susumu Ono, Tokyo (JP)

(73) Assignee: Elionix Inc., Tokyo (JP)

( * ) Notice: Subject to any disclaimer, the term of this patent is extended or adjusted under 35 U.S.C. 154(b) by 0 days.

(21) Appl. No.: 09/986,485

(22) Filed: Nov. 9, 2001

(65) Prior Publication Data

US 2003/0089858 A1 May 15, 2003

(51) Int. Cl.$^7$ .......................... G01N 23/00; G21K 7/00; G01K 1/08; H01J 3/14
(52) U.S. Cl. .................. 250/396 R; 250/396; 250/310; 250/311; 250/397
(58) Field of Search ........................... 250/396 R, 310, 250/311, 396, 397

(56) References Cited

U.S. PATENT DOCUMENTS

| | | | | |
|---|---|---|---|---|
| 3,569,771 A | * | 3/1971 | Pettit et al. ............... | 315/10 |
| 3,737,914 A | * | 6/1973 | Hertz ...................... | 347/22 |
| 3,949,228 A | * | 4/1976 | Ryan ...................... | 218/121.25 |
| 4,050,075 A | * | 9/1977 | Hertz et al. ................ | 347/37 |
| 4,335,309 A | * | 6/1982 | Anger et al. ............ | 250/396 R |
| 4,603,282 A | * | 7/1986 | Close ..................... | 315/399 |
| 5,053,684 A | * | 10/1991 | Nooyen .................. | 315/392 |
| 5,430,292 A | * | 7/1995 | Honjo et al. ............. | 250/310 |
| 5,578,821 A | * | 11/1996 | Meisberger et al. ....... | 250/310 |
| 5,843,603 A | * | 12/1998 | Ando et al. ............ | 250/396 R |
| 6,362,489 B2 | * | 3/2002 | Okino .................. | 250/396 R |

* cited by examiner

*Primary Examiner*—John R. Lee
*Assistant Examiner*—Bernard E. Souw
(74) *Attorney, Agent, or Firm*—Wenderoth, Lind & Ponack, L.L.P.

(57) ABSTRACT

In an electron beam lithography system, an outputted main signal is applied directly to deflection plates, whereas an outputted auxiliary signal is applied to the deflection plate through a capacitive coupling for writing a wide strip-like pattern accurately at a high speed. In the electron beam lithography system, a deflection signal is divided into a main signal having a low frequency and a large amplitude and an auxiliary signal having a high frequency and a small amplitude. The main signal is applied directly to deflection plates, and the auxiliary signal is applied to the deflection plate through a capacitor. In the case of writing a straight line having a certain width, and a solid graphic pattern, because the electron beam is deflected in a given direction and a given width by the use of the auxiliary signal in synchronism with one sweeping cycle based on the main signal, a line whose width is as wide as may times of the electron beam diameter can be written, and a graphic pattern having a certain width can be written at a high speed.

8 Claims, 9 Drawing Sheets waveform of an X main signal waveform of a Y main signal waveform of a Y composite signal waveform of a Y auxiliary signal waveform of an X main signal waveform of an X composite signal waveform of an X auxiliary signal waveform of a Y main signal waveform of a Y composite signal waveform of a Y auxiliary signal waveform of an X main signal waveform of a Y main signal waveform of a Y composite signal waveform of a Y auxiliary signal

ELECTRON BEAM LITHOGRAPHY SYSTEM AND METHOD

BACKGROUND OF THE INVENTION

1. Technical Field of the Invention

The present invention relates to an electron beam lithography system and a method for applying a narrowly converged electron beam to a specimen substrate such as a semiconductor substrate to write a pattern thereon, and more particularly to an apparatus and a method for deflecting an electron beam in an electron beam lithography system.

2. Description of the Related Art

In an electron beam lithography system, a narrowly converged electron beam is scanned and applied sequentially to target positions on a specimen substrate to form a pattern thereon. As shown in FIG. 1 of the accompanying drawings, an electron beam lithography system comprises an electron optical column 1, a specimen chamber 6, and a control system 9. The electron optical column 1 has an electron gun 2, at least one of electromagnetic lenses 3 and 4, and at least two deflectors 5. Each of the two deflectors 5 deflects an electron beam in the X and Y directions, and comprises deflection plates, a deflection amplifier, and a deflection power supply, and the like. The electron optical column 1 has a function for converging an electron beam emitted from the electron gun 2 to be smaller by the electromagnetic lenses 3 and 4, deflecting the electron beam by the deflectors 5 which apply electromagnetic forces, and applying the electron beam to a substrate 8 at a desired position on its surface. Further, the electron optical column 1 has a blanking function for blocking the electron beam in response to an external signal. The electron beam lithography system is capable of writing graphic patterns on a substrate by the focusing, deflecting, and blanking functions of the electron beam in the electron optical column 1. In the specimen chamber 6, there are provided a specimen stage 7 for holding the substrate 8 and moving the substrate 8, and a measuring mechanism (not shown) for measuring the position of the specimen stage 7. The control system 9 has a function for controlling the overall apparatus including the electron optical column 1, the specimen stage 7, and the like by a computer, and controlling a deflection amount of the electron beam and the position of the substrate in a pattern writing process.

The electron beam lithography process is such a process that a desired graphic pattern is written by deflecting the electron beam 10 with the deflectors 5 to apply an appropriate amount of electric charges to only necessary portions of an electron beam resist which has been coated on the surface of the substrate 8, as shown in FIG. 2. Applying an electron beam to an electron beam resist and exposing the electron beam resist is referred to as electron beam exposure, and a rectangular region swept by an electron beam is referred to as a field.

Processes of deflecting an electron beam include a raster-scan process and a vector-scan process. According to the raster-scan process, one field is sequentially and fully scanned from one end to the other at the same speed, and the electron beam is applied to only an area where a graphic pattern is to be written and is blocked for an area where no graphic pattern is to be written by a blanking mechanism. This process is disadvantageous in that it wastes a long period of time because the electron beam is deflected in the area where no graphic pattern is to be written.

According to the vector-scan process, the electron beam is not applied to, but skips, an area where no graphic pattern is to be written, and the electron beam is deflected only in an area where a graphic pattern is to be written. While this process is advantageous in that the electron beam is not applied to, but skips, the area where no graphic pattern is to be written, it requires a period of time limited by the frequency band of the deflection amplifier to move the electron beam from a position where writing of one graphic pattern finishes to a position where writing of a next graphic pattern starts. Therefore, if one field contains many small graphic patterns, then a waiting time required for the electron beam to move from a graphic pattern to another graphic pattern increases.

Noise of an electronic circuit can be represented in the following:

$$N = K \times V\text{max} \times f1/2 \qquad (1)$$

Where,

N . . . noise voltage,

Vmax . . . maximum value of the operating voltage of the electronic circuit, f . . . frequency band, and K . . . proportionality constant.

In the raster-scan process, the frequency band can be limited because the deflection direction, the deflection amount, and the deflection speed of the electron beam are constant. Therefore, the noise of the deflection amplifier can be reduced. In the vector-scan process, however, the deflection direction, the deflection amount, and the deflection speed of the electron beam are not constant depending on the graphic pattern to be written. After one graphic pattern has been written, it is necessary to move the electron beam quickly to a position where writing of a next graphic pattern starts. In order to lower the noise of the deflection amplifier to a certain value or less, the frequency band needs to be limited to a low frequency range, and there is a limit to acceleration of travel time of the electron beam.

In a conventional electron beam lithography system based on the vector-scan principle, when a solid graphic pattern is written, as shown in FIG. 3, the electron beam is scanned by a given width in the X direction, and thereafter deflected slightly in the Y direction and then scanned by the given width in the X direction. That is, the electron beam is deflected several times to fully scan a desired field in the X and Y directions.

FIGS. 4A and 4B are graphs showing deflection signals in the X and Y directions for drawing the rectangular graphic pattern shown in FIG. 3. FIG. 4A shows an X deflection signal and FIG. 4B shows a Y deflection signal. In FIGS. 4A and 4B, the horizontal axis represents time and the vertical axis represents the deflection signal (voltage signal). In this process, because the frequency band of the deflection signal (voltage signal) is limited to a low frequency range, the deflection speed of the electron beam is low, thereby requiring a long period of time to write the graphic pattern.

In order to solve the above problem, there has been proposed a method in which the deflection signal is divided into a main signal (voltage signal) having a low frequency and a large amplitude, and an auxiliary signal (voltage signal) having a high frequency and a small amplitude, whereby the electron beam is deflected in a large area by the main signal, and in a small area by the auxiliary signal. Because the noise of the signal is expressed by the equation (1), the overall noise can be reduced by dividing the deflection signal in this manner. According to a specific process, as shown in a conceptual view of FIG. 5, there has been proposed a method in which deflection plates dedicated for the main signal and the auxiliary signal are used. In the process shown in FIG. 5, main deflection plates 5-1, 5-2 and auxiliary deflection plates 5-3, 5-4 are provided. A main signal generator 11 and a main signal amplifier 13 are connected to the main deflection plates 5-1, 5-2, and an auxiliary signal generator 12 and an auxiliary signal amplifier 14 are connected to the auxiliary deflection plates 5-3, 5-4. In FIG. 5, only the main deflection plates 5-1, 5-2 and the auxiliary deflection plates 5-3, 5-4 for use in one direction, e.g., the X direction (or the Y direction) are illustrated. This method is disclosed in Japanese patent publication No. 1-52894, Japanese laid-open patent publications Nos. 57-90858, 11-224636, and 6-19639, for example. However, the method shown in FIG. 5 is problematic in that because the number of deflection plates increases, the spatial efficiency of the electron optical system is lowered.

According to another method, as shown in a conceptual view of FIG. 6, it has been proposed to connect the circuit's common of auxiliary signal generators and auxiliary signal amplifiers to the output of a main signal for thereby adding main and auxiliary signals. Specifically, in the method shown in FIG. 6, auxiliary signal generators 12 and auxiliary signal amplifiers 14 are connected to main deflection plates 5-1, 5-2, and the auxiliary signal generators 12 are connected to a main signal generator 11 and a main signal amplifier 13. In the method shown in FIG. 6, however, because not only the circuit's common of the power supply for the auxiliary signal generator 12, but also the circuit's common of the power supply for the auxiliary signals (not shown) and of the auxiliary signal amplifier 14, and also the circuit's common of the input and output circuits, connected to the auxiliary signal generator 12 must be kept in the same potentials of the circuit's common of the auxiliary signal generator 12, many circuits are required to be newly provided separately from the main signal generator 11, resulting in a complex circuit arrangement. This method is disclosed in Japanese laid-open patent publication No. 8-45460, for example.

It may be possible to connect the output of a main signal and the output of an auxiliary signal to each other. However, this method is not practically feasible because the auxiliary signal is governed by the main signal and cannot exercise its function at all. This method may be explained by analogy with a painting process where when a picture is drawn on a large canvas, details are drawn by a large paintbrush carried by both a person and a large crane, with the person being useless.

The method illustrated in FIG. 6 may be explained by analogy with a painting process where a person is suspended by a large crane and the suspended person draws details of a picture with a small paintbrush. Though the circuit of the process is complex, the process can be reduced to practice.

In the vector-scan process, the amount of charges applied to a point on a graphic pattern can be controlled by changing the time in which the electron beam stays on the point. Exposing all resist molecules in the irradiated area to the electron beam is referred to as full exposure, and exposing part of resist molecules in the irradiated area to the electron beam is referred to as intermediate exposure. When the resist in full exposure is developed, the resist is dissolved away. When the resist in intermediate exposure is developed, the resist which is not exposed remains undissolved. Continuously changing the amount of exposure is referred to as gradient exposure. When the resist in gradient exposure is developed, the amount of resist which remains undissolved corresponds to the amount of exposure. The gradient exposure makes it possible to process a resist according to a three-dimensional pattern.

According to the conventional gradient exposure, it has been customary to change the deflection speed of the electron beam for changing the amount of exposure. In order to change the deflection speed of the electron beam, it is necessary to specify parameters determining the deflection speed each time the deflection speed is to be changed, thus wasting a long period of time.

SUMMARY OF THE INVENTION

The present invention has been made in view of the above drawbacks. It is therefore an object of the present invention to provide an electron beam lithography system and a method which can write a pattern having a desired width at a high speed while maintaining positional accuracy of the written pattern.

Another object of the present invention is to provide a writing method which can eliminate a dead time in gradient exposure carried out by an electron beam lithography system.

The present invention relates to an electron beam deflection apparatus in which a deflection signal is divided into a main signal having a low frequency and a large amplitude and an auxiliary signal having a high frequency and a small amplitude for applying them to deflection plates, and the main signal is applied directly to the deflection plate and the auxiliary signal is applied to deflection plates through a capacitive coupling.

In this apparatus, the frequency band of the main signal (voltage signal) is limited to a low frequency range for reducing noise even at a large amplitude, and the voltage range of the auxiliary signal (voltage signal) is reduced for reducing noise even in a high frequency range.

According to the present invention, in the case of writing a straight line having a certain width or a solid graphic pattern, the electron beam is deflected at a high speed in a certain direction for a certain width using the auxiliary signal in synchronism with the deflection of the electron beam by the main signal. Therefore, it is possible to write a line which is as thick as many times the diameter of the electron beam. Consequently, a graphic pattern having a certain width can be written at a high speed.

By using an auxiliary signal having a nonlinear waveform which is asymmetric with respect to the zero level, the distribution of the amount of applied charges can be given a gradient in the direction in which the electron beam is deflected by the auxiliary signal.

DETAILED DESCRIPTION OF THE PREFERRED EMBODIMENTS

Embodiments of an electron beam lithography system and a method according to the present invention will be described below with reference to FIGS. 7 through 19.

Figure 1:
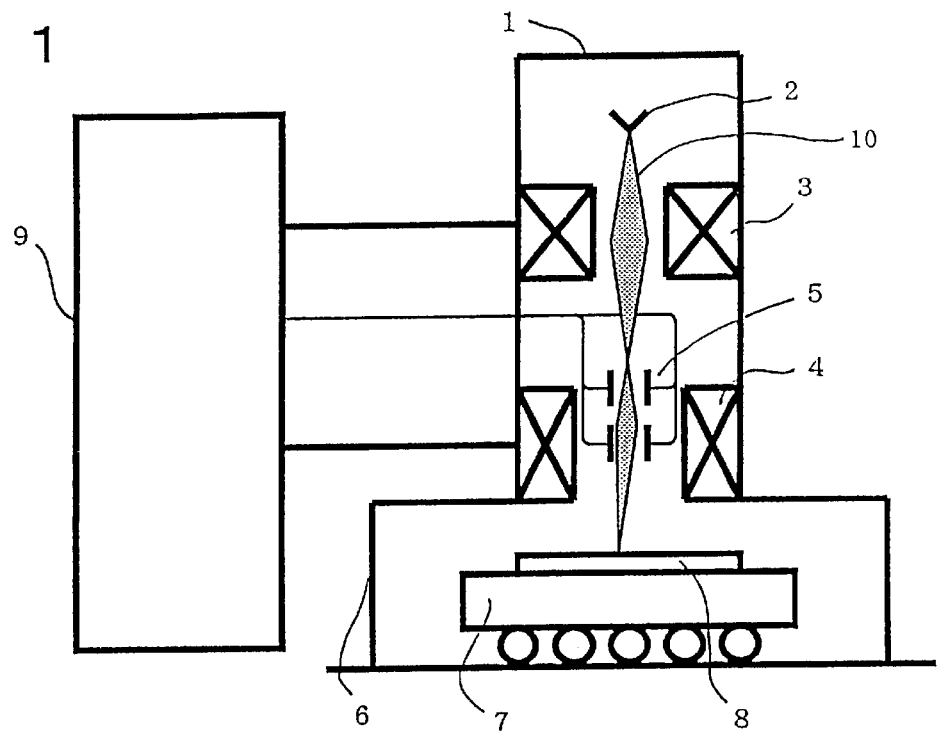
FIG. 1 is a schematic view showing a basic arrangement of an electron beam lithography system.
Figure 2:
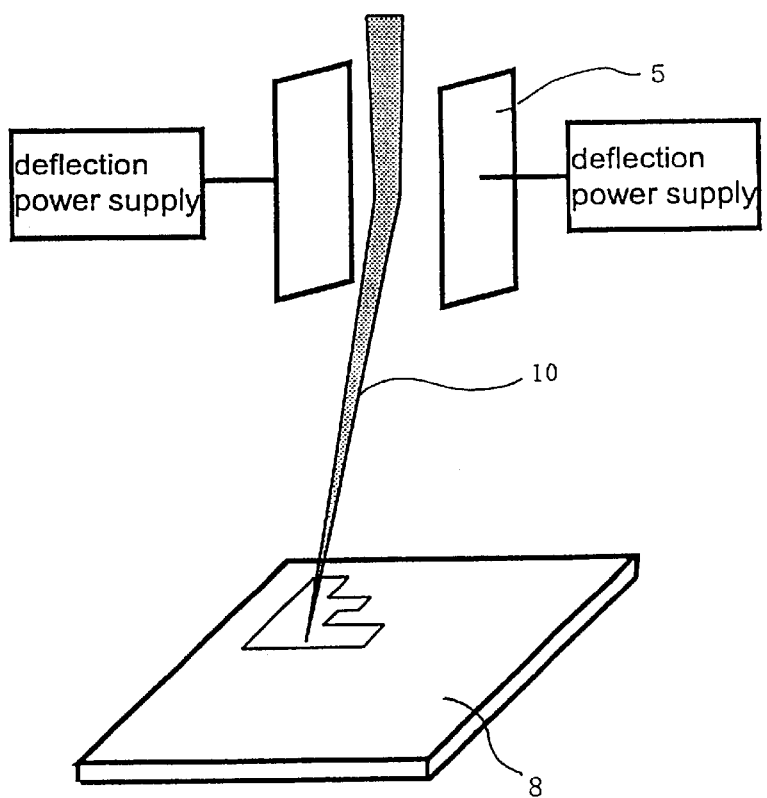
FIG. 2 is a schematic view showing an electron beam lithography process carried out by the electron beam lithography system.
Figure 3:
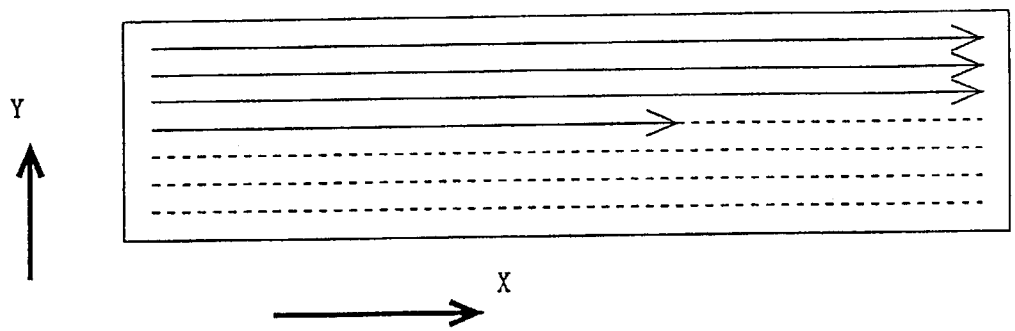
FIG. 3 is a diagram showing paths of an electron beam applied when a rectangular graphic pattern is written according to a conventional process.
Figure 4A:
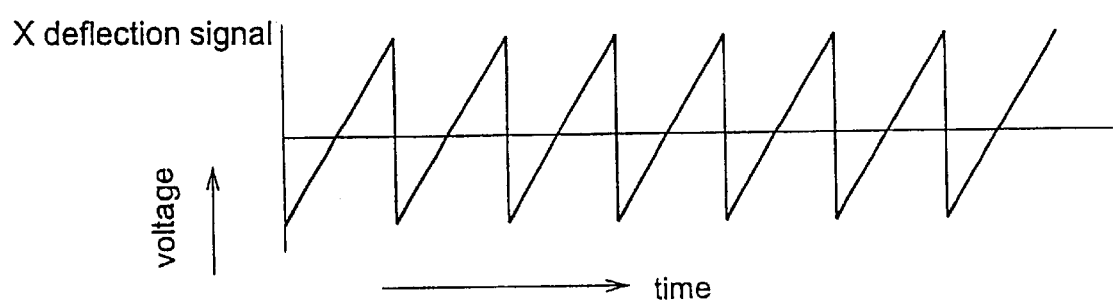
FIG. 4A is a graph showing an X deflection signal in the process shown in FIG. 3.
Figure 4B:
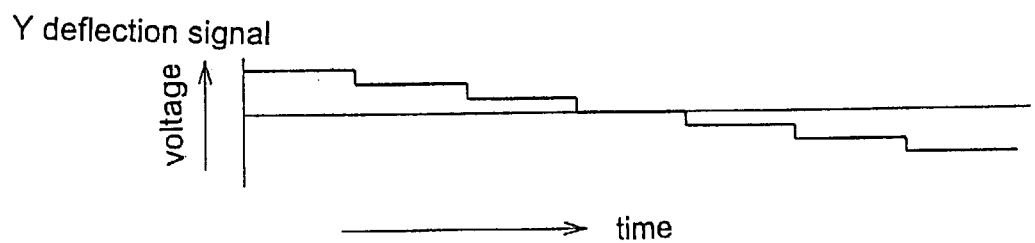
FIG. 4B is a graph showing a Y deflection signal in the process shown in FIG. 3.
Figure 5:
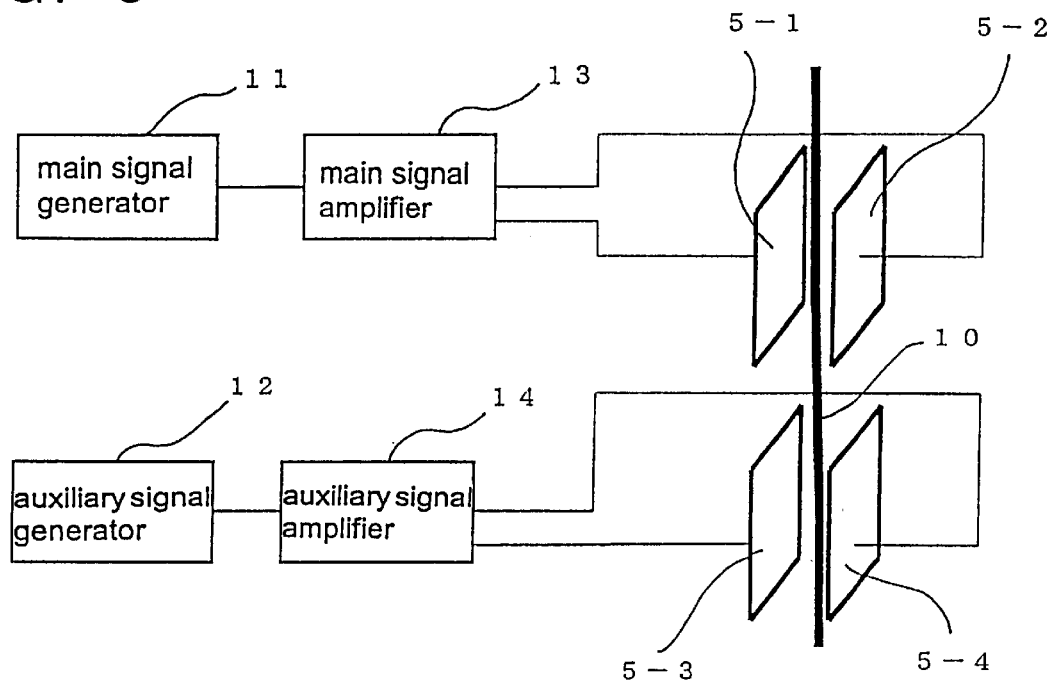
FIG. 5 is a schematic view of a conventional deflector in which a deflection signal is divided into a main signal and an auxiliary signal.
Figure 6:
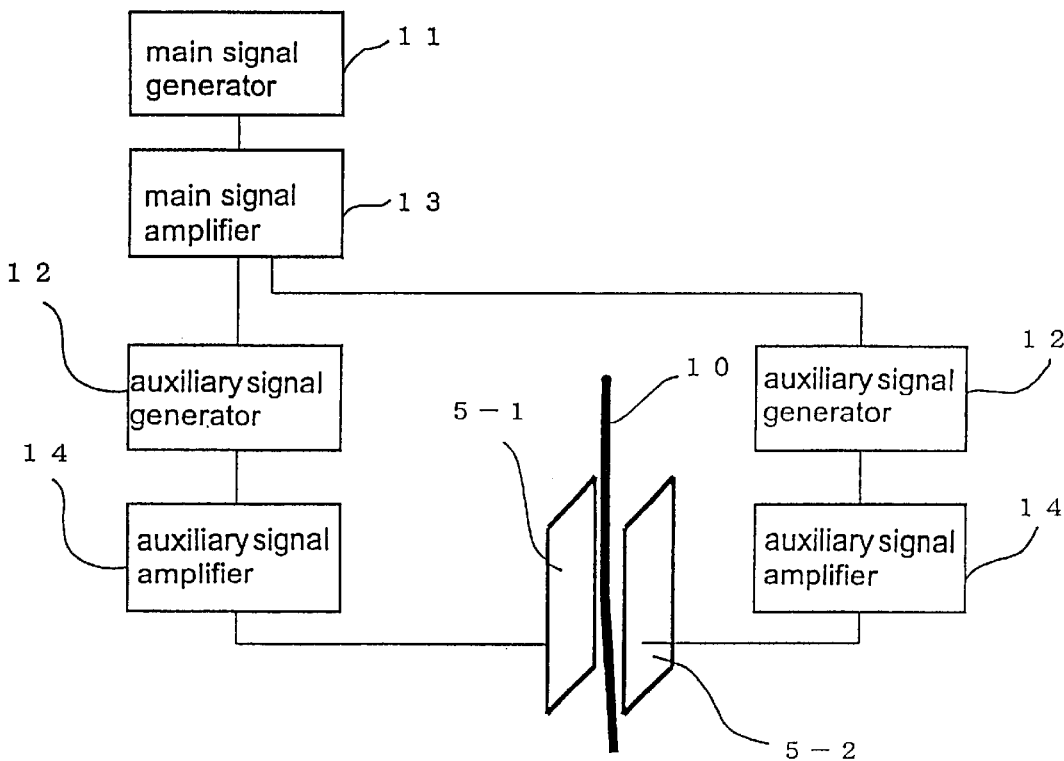
FIG. 6 is a schematic view of a conventional deflector in which the circuit's common of an auxiliary signal is connected to the output of a main signal for adding the main signal and the auxiliary signal.
Figure 7:
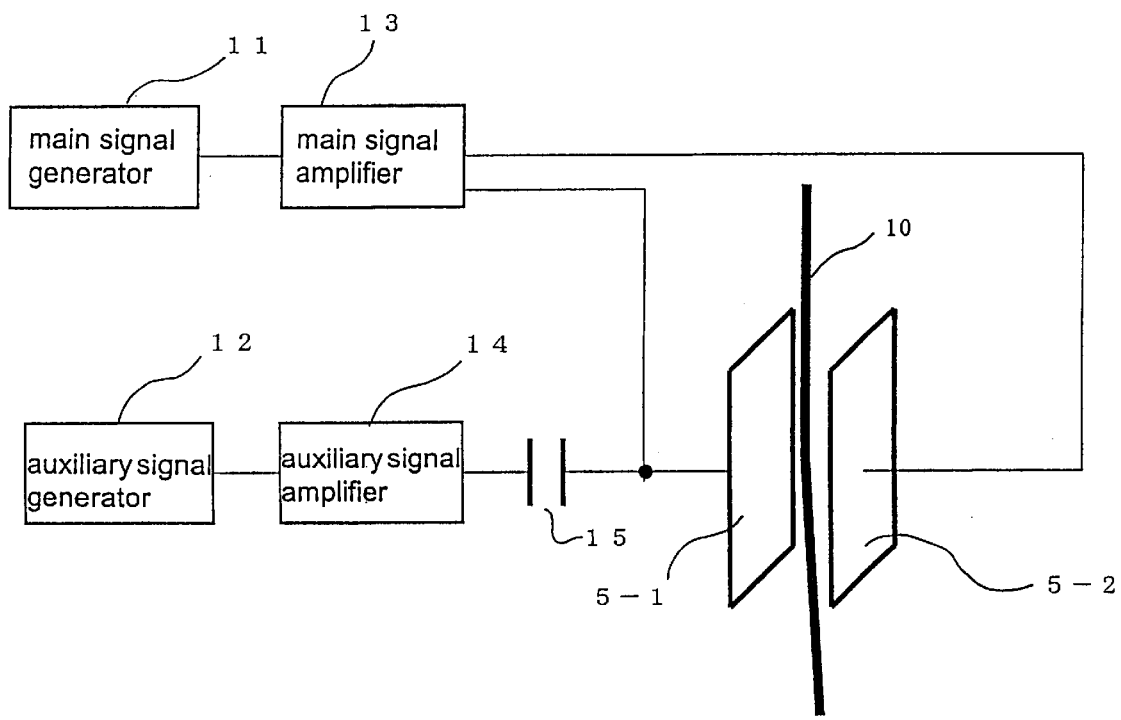
FIG. 7 is a schematic view showing a basic arrangement of a deflector in an electron beam lithography system according to the present invention.

FIG. 7 is a schematic view showing an embodiment of an electron beam lithography system according to the present invention. According to the present invention, a main signal is applied directly to deflection plates, and an auxiliary signal is applied through a capacitor to the deflection plate. Specifically, as shown in FIG. 7, a main signal generator 11 and a main signal amplifier 13 are connected directly to deflection plates 5-1, 5-2, and an auxiliary signal generator 12 and an auxiliary signal amplifier 14 are connected to the deflection plate 5-1 through a capacitor 15. A main signal generated by the main signal generator 11 is amplified by the main signal amplifier 13, and then applied directly to the deflection plates 5-1, 5-2. An auxiliary signal generated by the auxiliary signal generator 12 is adjusted in amplitude by the auxiliary signal amplifier 14, and then applied to the deflection plate 5-1 through the capacitor 15. An electron beam 10 which passes centrally between the deflection plates 5-1, 5-2 is deflected to change its path by an electric field produced by the deflection plates 5-1, 5-2, and applied to a specimen substrate at a desired position thereon. The electron beam is normally deflected in two perpendicular directions, and while only the X direction is shown in FIG. 7, a similar arrangement is also provided for the Y direction.

Figure 8:
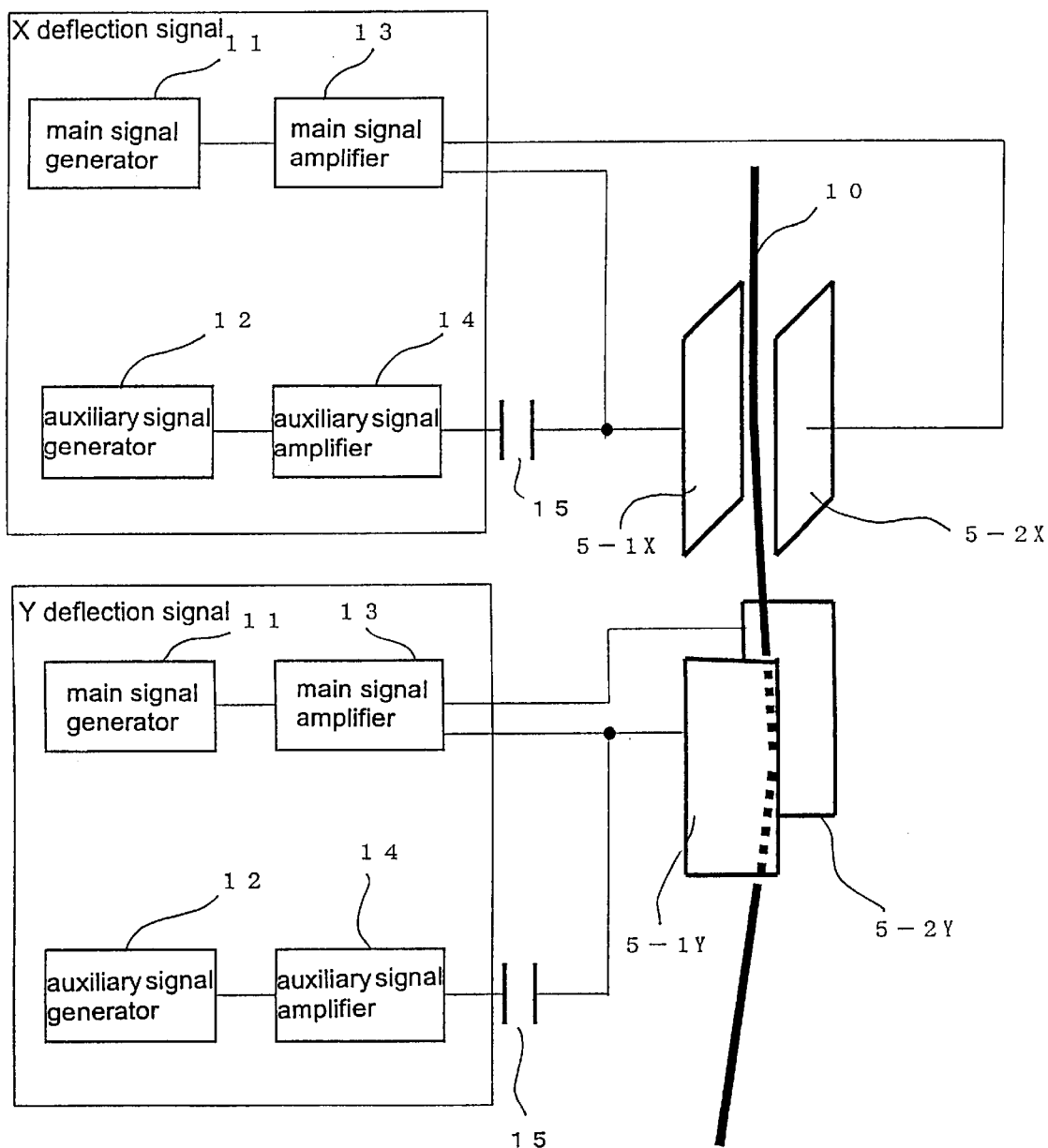
FIG. 8 is a schematic view showing an embodiment of the deflector in the electron beam lithography system according to the present invention.

FIG. 8 is a schematic view showing an example having an X deflector and a Y deflector, the Y deflector being identical in structure to the X deflector and disposed in a position perpendicular to the X deflector. First, the X deflector will be described below with reference to FIG. 8. A main signal generated by a main signal generator 11 is amplified in amplitude by a main signal amplifier 13, and applied directly to deflection plates 5-1X, 5-2X. An auxiliary signal generated by an auxiliary signal generator 12 is adjusted in amplitude by an auxiliary signal amplifier 14, and then applied to the deflection plate 5-1X through a capacitor 15. The Y deflector will be described below with reference to FIG. 8. A main signal generated by a main signal generator 11 is amplified in amplitude by a main signal amplifier 13, and applied directly to deflection plates 5-1Y, 5-2Y. An auxiliary signal generated by an auxiliary signal generator 12 is adjusted in amplitude by an auxiliary signal amplifier 14, and then applied to the deflection plate 5-1Y through a capacitor 15.

Examples written by the electron beam lithography system having the deflectors shown in FIG. 8 will be described below.

Figure 9:
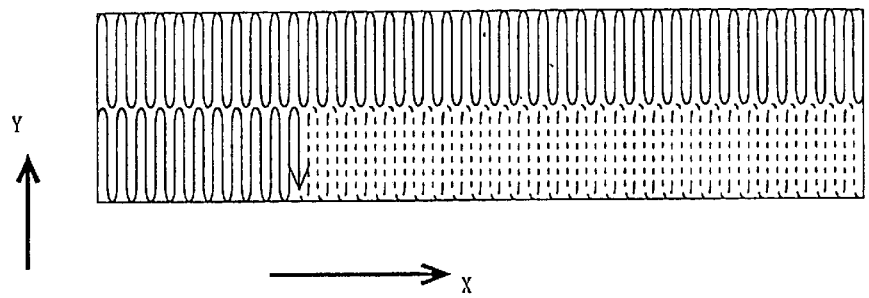
FIG. 9 is a diagram showing paths of an electron beam applied in a written example 1 when a rectangular graphic pattern is written by a process according to the present invention.

A written example 1 is shown in FIG. 9. In the written example 1, a solid rectangular pattern is written. The electron beam is deflected in a direction (the Y direction in FIG. 9) perpendicular to the main signal by the auxiliary signal to write an area having a certain width in a short period of time.

Figure 10:
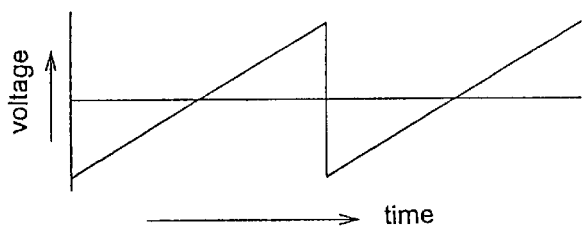
FIG. 10 is a graph showing the waveform of an X main signal in the process shown in FIG. 9.
Figure 11A:
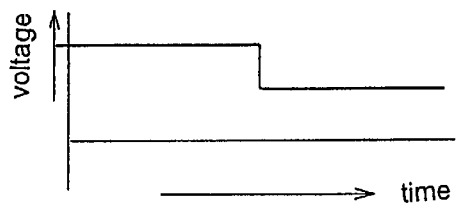
FIG. 11A is a graph showing the waveform of a Y main signal in the process shown in FIG. 9.
Figure 11C:
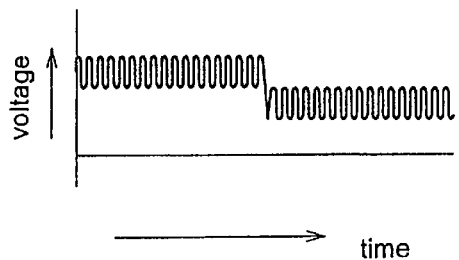
FIG. 11C is a graph showing the waveform of a Y composite signal representing the sum of the signals shown in FIGS. 11A and 11B.
Figure 11B:
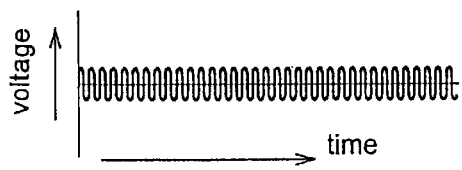
FIG. 11B is a graph showing the waveform of a Y auxiliary signal in the process shown in FIG. 9.

FIGS. 10 and 11A through 11C are graphs showing deflection signals in the x and Y directions for writing the rectangular graphic pattern shown in FIG. 9. FIG. 10 shows the waveform of an X main signal, FIG. 11A shows the waveform of a Y main signal, FIG. 11B shows the waveform of a Y auxiliary signal, and FIG. 11C shows the waveform of a Y composite signal which is the sum of the signals shown in FIGS. 11A and 11B. In FIGS. 10 and 11A through 11C, the horizontal axis represents time and the vertical axis represents the deflection signal (voltage signal). In this process, the X main signal shown in FIG. 10 is applied to the deflection plates 5-1X, 5-2X, and the Y composite signal shown in FIG. 11C is applied to the deflection plate 5-1Y.

Figure 12:
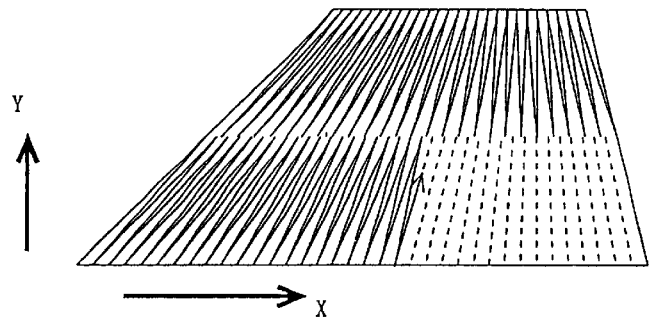
FIG. 12 is a schematic view showing paths of an electron beam applied when a trapezoidal graphic pattern is written by the process according to the present invention.

FIG. 12 shows a written example 2 where a solid trapezoidal pattern is written. The amplitudes of the X auxiliary signal and the Y auxiliary signal are controlled synchronously with the main signal for controlling the deflection direction and the deflection width of the electron beam. At the left end, the auxiliary deflection angle is equalized to the left gradient angle. The gradient angle is progressively changed toward the right. At the right end, the auxiliary deflection angle is equalized to the right gradient angle. This cycle is repeated to write a trapezoidal pattern efficiently and smoothly along oblique lines.

Figure 13A:
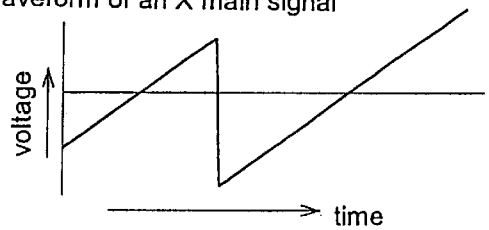
FIG. 13A is a graph showing the waveform of an X main signal in the process shown in FIG. 12.
Figure 13C:
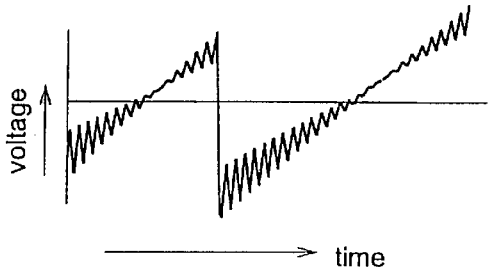
FIG. 13C is a graph showing the waveform of an X composite signal representing the sum of the signals shown in FIGS. 13A and 13B.
Figure 13B:
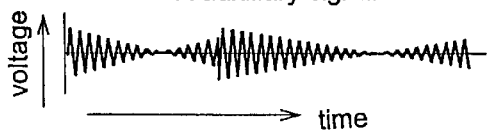
FIG. 13B is a graph showing the waveform of an X auxiliary signal in the process shown in FIG. 12.
Figure 14A:
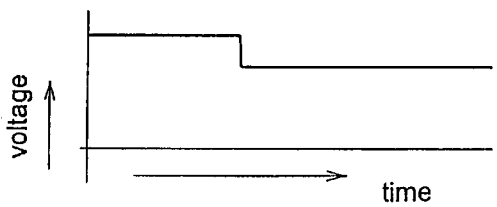
FIG. 14A is a graph showing the waveform of a Y main signal in the process shown in FIG. 12.
Figure 14C:
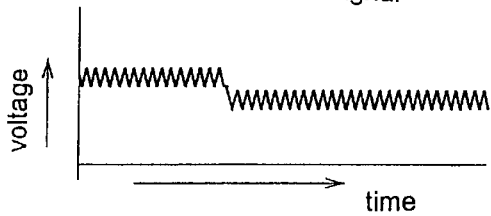
FIG. 14C is a graph showing the waveform of a Y composite signal representing the sum of the signals shown in FIGS. 14A and 14B.
Figure 14B:
FIG. 14B is a graph showing the waveform of a Y auxiliary signal in the process shown in FIG. 12.

FIGS. 13A through 13C and 14A through 14C are graphs showing deflection signals in the X and Y directions for writing the trapezoidal graphic pattern shown in FIG. 12. FIG. 13A shows the waveform of an X main signal, FIG. 13B shows the waveform of an X auxiliary signal, and FIG. 13C shows the waveform of an X composite signal which is the sum of the signals shown in FIGS. 13A and 13B. FIG. 14A shows the waveform of a Y main signal, FIG. 14B shows the waveform of a Y auxiliary signal, and FIG. 14C shows the waveform of a Y composite signal which is the sum of the signals shown in FIGS. 14A and 14B. In this process, the X composite signal shown in FIG. 13C is applied to the deflection plates 5-1X, 5-2X, and the Y composite signal shown in FIG. 14C is applied to the deflection plate 5-1Y.

Figure 15:
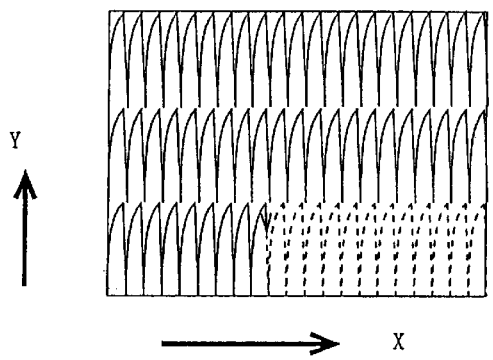
FIG. 15 is a schematic view showing paths of an electron beam applied in a written example 3 when the amount of applied charges is changed depending on the position by the process according to the present invention.

FIG. 15 shows a written example 3 where a three-dimensional structure is processed according to gradient exposure.

Figure 16:
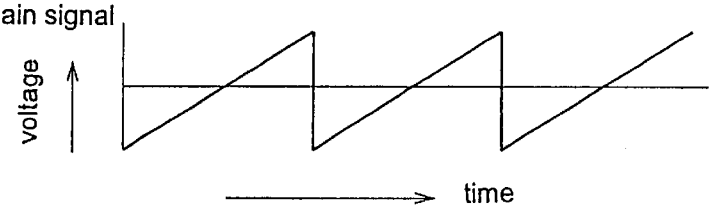
FIG. 16 is a graph showing the waveform of an X main signal in the process shown in FIG. 15.
Figure 17A:
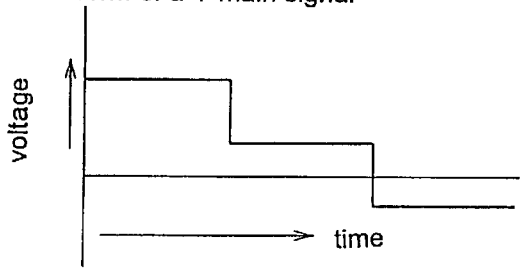
FIG. 17A is a graph showing the waveform of a Y main signal in the process shown in FIG. 15.
Figure 17C:
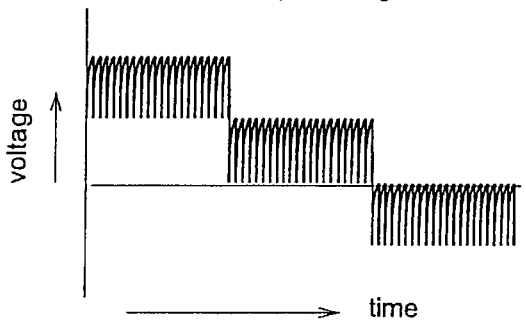
FIG. 17C is a graph showing the waveform of a Y composite signal representing the sum of the signals shown in FIGS. 17A and 17B.
Figure 17B:
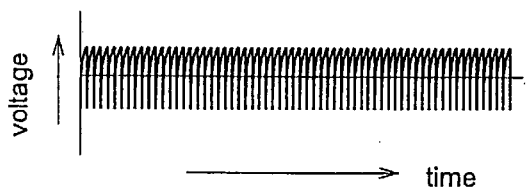
FIG. 17B is a graph showing the waveform of a Y auxiliary signal in the process shown in FIG. 15.
Figure 18:
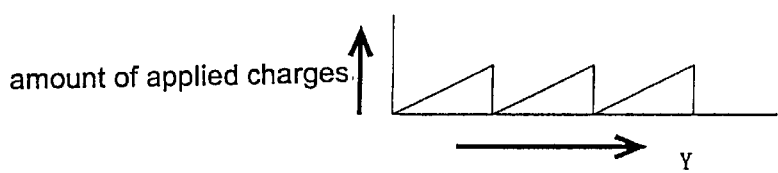
FIG. 18 is a graph showing the amount of applied charges as it varies in the Y direction of a processed surface in the process shown in FIG. 15.
Figure 19:
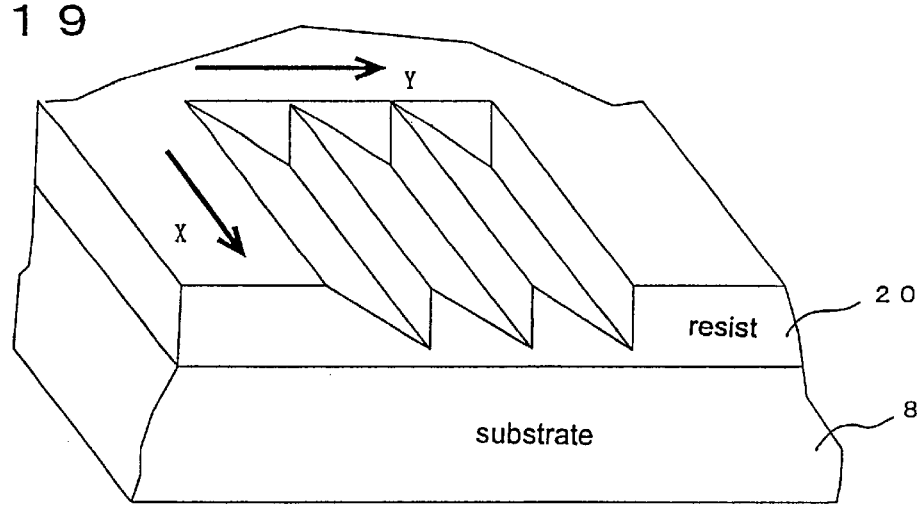
FIG. 19 is a perspective view, partly in cross section, of a three-dimensional shape which is produced in a resist by an electron beam according to the process shown in FIG. 15 and developed.

FIGS. 16 and 17A through 17C are graphs showing deflection signals in the X and Y directions for writing the rectangular graphic pattern shown in FIG. 15. FIG. 16 shows the waveform of an X main signal, FIG. 17A shows the waveform of a Y main signal, FIG. 17B shows the waveform of a Y auxiliary signal, and FIG. 17C shows the waveform of a Y composite signal which is the sum of the signals shown in FIGS. 17A and 17B. In FIGS. 16 and 17A through 17C, the horizontal axis represents time and the vertical axis represents the deflection signal (voltage signal). In this process, the X main signal shown in FIG. 16 is applied to the deflection plates 5-1X, 5-2X, and the Y composite signal shown in FIG. 17C is applied to the deflection plates 5-1Y, 5-2Y. When the auxiliary signal shown in FIG. 17B is of a logarithmic curve, the amount of applied charges changes linearly as shown in FIG. 18. By differentiating the amount of applied charges, the extent of exposure can be changed from a fully exposed area to a substantially unexposed area. This exposure process is referred to as gradient exposure. When a resist processed in the gradient exposure is developed, as shown in FIG. 19, a resist 20 on a substrate 8 has a remaining thickness corresponding to the amount of applied charges. By using this process, a relief pattern of a three-dimensional structure can be produced on the surface of the resist.

As described above, according to the present invention, in a mechanical structure, the number of deflectors is not required to be increased, and all the circuit's common of the related electronic circuits can be connected in one point, thereby simplifying the structure of the apparatus and realizing the apparatus easily.

According to the present invention, when the peripheral area of a spot irradiated by an electron beam based on a main signal is scanned with a high-frequency auxiliary signal, an area which is larger than the diameter of the electron beam can be irradiated with the electron beam at a high speed. Straight lines having a certain width and solid graphic patterns can be written in a reduced period of time because the number of scanning lines based on the main signal can be reduced.

Further, according to the present invention, the waveform of an auxiliary signal may be selected to perform gradient exposure for performing a three-dimensional processing.

What is claimed is:

1. An electron beam lithography system for deflecting an electron beam using deflection plates and applying the electron beam to a surface of a substrate, characterized in that:
    a main signal having a low frequency and a large amplitude is applied directly to a pair of deflection plates, and an auxiliary signal having a high frequency and a small amplitude is applied to one of the pair of deflection plates through a capacitive coupling.

2. An electron beam lithography system according to claim 1, characterized in that the auxiliary signal has a waveform represented by a repetition of a nonlinear function such that the amount of applied charges is varied within an area to which a pattern is to be written.

3. An electron beam lithography system according to claim 1, characterized in that:
    synchronizing with the main signal which deflects an electron beam by a large distance in the X direction, the ratio of the X auxiliary signal to the Y auxiliary signal is adjusted to deflect an electron beam with the auxiliary signals in the desired direction so as to be equal to the desired angle measured from the X direction, the deflected directions of an electron beam by the auxiliary signals are adjusted to be equal to the desired values at the starting point and/or end point of the deflection by the main signal; and
    the electron beam is coarsely deflected by the main signal in the X and Y directions, and finely deflected with the auxiliary signals in a desired direction for thereby writing a graphic pattern enclosed by oblique lines.

4. An electron beam lithography system for deflecting an electron beam using deflection plates and applying the electron beam to a surface of a substrate, said electron beam lithography system comprising:
    a pair of deflection plates;
    a main signal generator operable to generate a main signal;
    a main signal amplifier operable to receive the main signal generated by said main signal generator and amplify the main signal in order to output a main signal having a low frequency and a large amplitude which is applied directly to each one of said pair of deflection plates;
    an auxiliary signal generator operable to generate an auxiliary signal;
    an auxiliary signal amplifier operable to receive the auxiliary signal generated by said auxiliary signal generator and amplify the auxiliary signal in order to output an auxiliary signal having a high frequency and a small amplitude which is applied to one of said pair of deflection plates through a capacitive coupling.

5. An electron beam lithography system as claimed in claim 4, wherein the auxiliary signal output from said auxiliary signal amplifier has a waveform represented by a repetition of a nonlinear function such that an amount of applied charges is varied within a deflected area to which a pattern is to be written.

6. An electron beam lithography method for deflecting an electron beam using a pair of deflection plates and applying the electron beam to a surface of a substrate, said electron beam lithography method comprising:
    generating a main signal;
    amplifying the main signal to produce a main signal having a low frequency and a large amplitude;

applying the main signal having a low frequency and a large amplitude directly to each one of the pair of deflection plates;

generating an auxiliary signal;

amplifying the auxiliary signal in order to produce an auxiliary signal having a high frequency and a small amplitude;

applying the auxiliary signal having a high frequency and a small amplitude to one of the pair of deflection plates through a capacitive coupling.

7. An electron beam lithography system as claimed in claim 6, wherein the auxiliary signal output from said auxiliary signal amplifier has a waveform represented by a repetition of a nonlinear function such that an amount of applied charges is varied within an area to which a pattern is to be written.

8. An electron beam lithography system for deflecting an electron beam using deflection plates and applying the electron beam to a surface of a substrate, said electron beam lithography system comprising:

a pair of X-deflection plates;

an X-main signal generator operable to generate an X-main signal;

an X-main signal amplifier operable to receive the X-main signal generated by said X-main signal generator and amplify the X-main signal in order to output an amplified X-main signal having a low frequency and a large amplitude which is applied directly to each one of said pair of X-deflection plates;

an X-auxiliary signal generator operable to generate an X-auxiliary signal;

an X-auxiliary signal amplifier operable to receive the X-auxiliary signal generated by said X-auxiliary signal generator and amplify the X-auxiliary signal in order to output an amplified X-auxiliary signal having a high frequency and a small amplitude which is applied to one of said pair of X-deflection plates through a capacitive coupling;

a pair of Y-deflector plates disposed in a position perpendicular to said pair of X-deflector plates;

a Y-main signal generator operable to generate a Y-main signal;

a Y-main signal amplifier operable to receive the Y-main signal generated by said Y-main signal generator and amplify the Y-main signal in order to output an amplified Y-main signal having a low frequency and a large amplitude which is applied directly to each one of said pair of Y-deflection plates;

a Y-auxiliary signal generator operable to generate a Y-auxiliary signal; and a Y-auxiliary signal amplifier operable to receive the Y-auxiliary signal generated by said Y-auxiliary signal generator and amplify the Y-auxiliary signal in order to output an amplified Y-auxiliary signal having a high frequency and a small amplitude which is applied to one of said pair of Y-deflection plates through a capacitive coupling;

wherein the amplitudes of the X-auxiliary signal and the Y-auxiliary signal are controlled synchronously with the X-main signal and Y-main signal, respectively, to control the deflection direction and the deflection width of the electron beam.

* * * * *